(12) United States Patent
Oohori et al.

(10) Patent No.: US 10,765,050 B2
(45) Date of Patent: Sep. 1, 2020

(54) COMPONENT MOUNTING METHOD

(71) Applicant: Panasonic Intellectual Property Management Co., Ltd., Osaka (JP)

(72) Inventors: Tetsushi Oohori, Yamanashi (JP); Kenichiro Ishimoto, Yamanashi (JP); Atsushi Nakazono, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 184 days.

(21) Appl. No.: 15/408,676

(22) Filed: Jan. 18, 2017

(65) Prior Publication Data
US 2017/0231127 A1 Aug. 10, 2017

(30) Foreign Application Priority Data

Feb. 10, 2016 (JP) .................................. 2016-023251

(51) Int. Cl.
*H05K 13/04* (2006.01)
*H05K 13/08* (2006.01)

(52) U.S. Cl.
CPC ....... *H05K 13/046* (2013.01); *H05K 13/0882* (2018.08)

(58) Field of Classification Search
CPC .... H05K 13/02; H05K 13/04; H05K 13/0404; H05K 13/0408; H05K 13/0409; H05K 13/041; H05K 13/046; H05K 13/0882
See application file for complete search history.

(56) References Cited

U.S. PATENT DOCUMENTS

| | | | | |
|---|---|---|---|---|
| 2002/0166225 | A1* | 11/2002 | Kodama | H05K 13/0882 29/592.1 |
| 2003/0098798 | A1 | 5/2003 | Kato | |
| 2015/0045916 | A1 | 2/2015 | Yokomae et al. | |

FOREIGN PATENT DOCUMENTS

| | | | |
|---|---|---|---|
| CN | 202331128 U | | 7/2012 |
| CN | 102635543 A | | 8/2012 |
| CN | 104346911 A | | 2/2015 |
| JP | 2003-204199 A | | 7/2003 |
| JP | 2003204190 A | * | 7/2003 |
| JP | 2004087758 A | * | 3/2004 |

(Continued)

OTHER PUBLICATIONS

English Translation of Chinese Search Report dated Jan. 6, 2020 for the related Chinese Patent Application No. 201710016989.9.

*Primary Examiner* — Carl J Arbes
(74) *Attorney, Agent, or Firm* — Pearne & Gordon LLP

(57) ABSTRACT

A component mounting system includes a component mounting line in which a plurality of processing devices are connected to constitute the component mounting line and a management device (management computer) connected to the component mounting line by a network, and each of the plurality of processing devices can be remotely operated via the network by an input unit of the management device. In this component mounting system, a remote operation right allowing a remote operation is set with respect to the management device (ST21), and the remote operation right set with respect to the management device is released (ST23) in a case where a specific operation set in advance with respect to the one or more processing devices is performed (Yes in ST41) in a state where the remote operation right is set with respect to the management device.

11 Claims, 11 Drawing Sheets

(56) References Cited

FOREIGN PATENT DOCUMENTS

| JP | 2005236097 | A | * | 9/2005 |
| JP | 2009064902 | A | * | 3/2009 |
| JP | 2011040795 | A | * | 2/2011 |
| JP | 2012151515 | A | * | 8/2012 |
| JP | 2012151516 | A | * | 8/2012 |

* cited by examiner

COMPONENT MOUNTING METHOD

BACKGROUND

1. Technical Field

The present disclosure relates to a component mounting system and a component mounting method for component mounting on a board.

2. Description of the Related Art

A mounting board, which is a hoard that has a component mounted thereon, is manufactured in a component mounting line in which a plurality of processing devices such as a solder printing device, a post-solder printing inspection device, a component mounting device, and a post-component mounting inspection device are connected to constitute the component mounting line. Regarding such component mounting lines, a component mounting system in which not only an on-site operation but also a remote operation can be performed has been disclosed, the on-site operation being performed directly by a field worker on operation panels disposed in the processing devices for various field works such as component supply and device error response and the remote operation being performed by a remote worker for processing device operations from a management device other than the processing devices such as an external PC (for example, refer to PTL 1).

CITATION LIST

Patent Literature
PTL 1: Japanese Patent Unexamined Publication No. 2003-204199

SUMMARY

An object of the present disclosure is to provide a component mounting system and a component mounting method allowing an appropriate on-site operation and an appropriate remote operation to be performed with respect to a processing device constituting a component mounting line.

A component mounting system according to the present disclosure is a component mounting system including a component mounting line in which one or more processing devices are connected to constitute the component mounting line and a management device connected to the component mounting line by a network. The component mounting system includes a remote operation control unit allowing each of the one or more processing devices to be remotely operated via the network by an input unit of the management device; and an operation right setting unit that sets a remote operation right with respect to the management device, the remote operation right allowing a state to be achieved where the remote operation of the one or more processing devices can be performed by the input unit of the management device. The operation right setting unit releases the remote operation right set with respect to the management device in a case where there is a request for an operation by an input unit of the one or more processing devices in a state where the remote operation right is set with respect to the management device.

A component mounting system according to the present disclosure is a component mounting system including a component mounting line in which one or more processing devices are connected to constitute the component mounting line and a management device connected to the component mounting line by a network. The component mounting system includes a remote operation control unit allowing each of the one or more processing devices to be remotely operated via the network by an input unit of the management device; and an operation right setting unit that sets a remote operation right with respect to the management device, the remote operation right allowing a state to be achieved where the remote operation of the one or more processing devices can be performed by the input unit of the management device. The operation right setting unit releases the remote operation right set with respect to the management device in a case where a specific operation set in advance with respect to the one or more processing devices is performed in a state where the remote operation right is set with respect to the management device.

A component mounting method according to the present disclosure is a component mounting method for a component mounting system including a component mounting line in which one or more processing devices are connected to constitute the component mounting line and a management device connected to the component mounting line by a network and allowing each of the one or more processing devices to be remotely operated via the network by an input unit of the management device. The component mounting method includes setting a remote operation right with respect to the management device, the remote operation right allowing a state to be achieved where the remote operation of the one or more processing devices can be performed by the input unit of the management device; and releasing the remote operation right set with respect to the management device in a case where there is a request for an operation by an input unit of the one or more processing devices in a state where the remote operation right is set with respect to the management device.

A component mounting method according to the present disclosure is a component mounting method for a component mounting system including a component mounting line in which one or more processing devices are connected to constitute the component mounting line and a management device connected to the component mounting line by a network and allowing each of the one or more processing devices to be remotely operated via the network by an input unit of the management device. The component mounting method includes setting a remote operation right with respect to the management device, the remote operation right allowing a state to be achieved where the remote operation of the one or more processing devices can be performed by the input unit of the management device; and releasing the remote operation right set with respect to the management device in a case where a specific operation set in advance with respect to the one or more processing devices is performed in a state where the remote operation right is set with respect to the management device.

According to the present disclosure, an on-site operation and a remote operation can be appropriately performed with respect to a processing device constituting a component mounting line.

DETAILED DESCRIPTION

Figure 1:
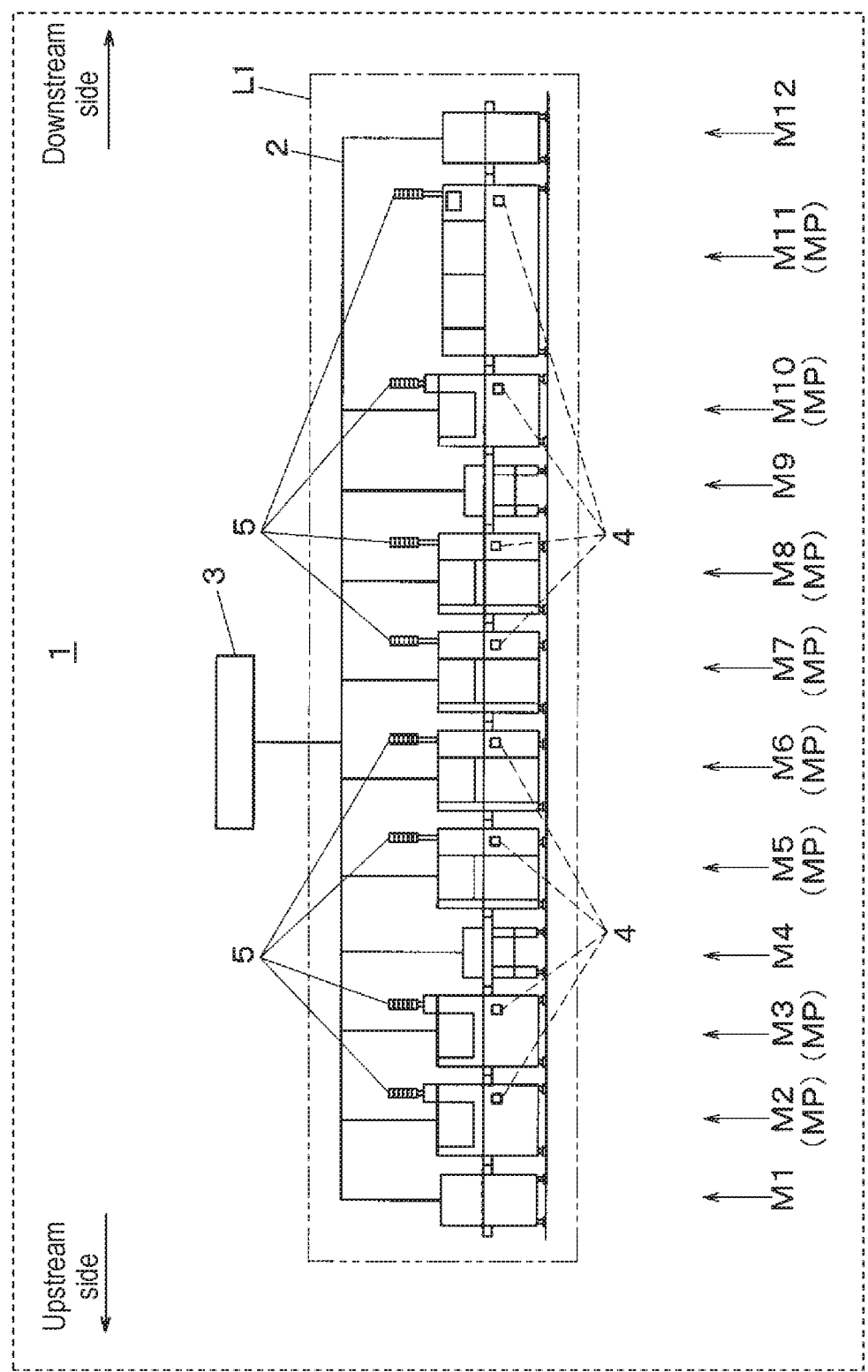
FIG. 1 is an explanatory diagram illustrating a configuration of a component mounting system according to an exemplary embodiment of the present disclosure.

A problem related to the system according to the related art will be briefly described before an exemplary embodiment of the present disclosure is described. No specific operation method based on the remote operation has been disclosed with regard to the component mounting systems according to the related art including that disclosed in PTL 1, and there is room for improvement in a case where an actual operation is assumed in which the on-site operation by the field worker and the remote operation from the management device by the remote worker are carried out along with each other with respect to the processing device constituting the component mounting line.

Hereinafter, one exemplary embodiment of the present disclosure will be described in detail with reference to accompanying drawings. The configurations, shapes, and the like described below are examples for descriptive purposes and can be appropriately changed in accordance with specifications of component mounting systems. In the following description, the same reference numerals will be used to refer to elements common to all the drawings so that the same description does not have to be repeated.

A configuration of component mounting system 1 will be described first with reference to FIG. 1. Component mounting system 1 is configured to connect component mounting line L1 with communication network 2 and entire component mounting system 1 is configured to be controlled by management computer 3. Board supply device M1, solder printing device M2, post-solder printing inspection device M3, board delivery device M4, component mounting devices M5 to M8, board delivery device M9, post-component mounting inspection device M10, reflow device M11, and board recovery device M12 are connected in series from an upstream side toward a downstream side in a board transport direction to constitute component mounting line L1.

Board supply device M1 in FIG. 1 functions to supply a board as a mounting target, board delivery devices M4 and M9 in FIG. 1 function to receive the board from upstream-side devices and deliver the board to downstream-side devices, and board recovery device M12 in FIG. 1 functions to recover the board after a component is mounted. In this manner, board supply device M1, board delivery devices M4 and M9, and board recovery device M12 supply, deliver, and recover the board in relation to processing devices MP (described later) without executing a work for component mounting with respect to the board transported in component mounting line L1. Solder printing device M2 executes a solder printing work (work for component mounting), in which a solder is printed onto the board as the mounting target by a solder printing working unit (working unit).

Post-solder printing inspection device M3 executes a post-solder printing inspection work (work for component mounting), in which a state of the solder printed onto the board is inspected by a post-solder printing inspection working unit (working unit) including a solder inspection camera. Each of component mounting devices M5 to M8 executes a component mounting work (work for component mounting), in which the component is placed onto the board by a component mounting working unit (working unit). Post-component mounting inspection device M10 executes a post-component mounting inspection work (work for component mounting), in which a state of the component placed on the board is inspected by a post-component mounting inspection working unit (working unit) including a component inspection camera. Reflow device M11 executes a board heating work (work for component mounting), in which the board moved into the device is heated by a board heating unit (working unit), the solder on the board is cured, and an electrode portion of the board is bonded to the electronic component.

Each of solder printing device M2, post-solder printing inspection device M3, component mounting devices M5 to M8, post-component mounting inspection device M10, and reflow device M11 has device buzzer 4 and signal tower 5. A main function of device buzzers 4 is to notify a field worker of device error occurrence in the respective devices by using a sound, the field worker performing various works such as device operations and component supply in component mounting line L1. Signal towers 5 function to notify the field worker of device errors in the respective devices by using a visual expression such as turning on, turning off, and blinking of a signal lamp.

As described above, solder printing device M2, post-solder printing inspection device M3, component mounting devices M5 to M8, post-component mounting inspection device M10, and reflow device M11 are processing devices MP that execute the works for component mounting with the working units with respect to the board transported in component mounting line L1. In other words, component mounting system 1 includes component mounting line L1, in which the plurality of processing devices MP (solder printing device M2, post-solder printing inspection device M3, component mounting devices M5 to M8, post-component mounting inspection device M10, and reflow device M11) are connected to constitute component mounting line L1, and management computer 3 (management device) connected to component mounting line L1 by communication network 2 (network).

In component mounting system 1, the solder printing work, the post-solder printing inspection work, the component mounting work, the post-component mounting inspection work, and the board heating work are executed in this order by processing devices MP with respect to the board transported in component mounting line L1, and then a mounting board on which the component is mounted via the solder is manufactured.

Component mounting line L1 is not limited to the configuration described above, and the number of component mounting devices M5 to M8 may be one or may be five or more. In addition, component mounting system 1 may be configured for a plurality of component mounting lines L1 to be controlled by single management computer 3.

Figure 2:
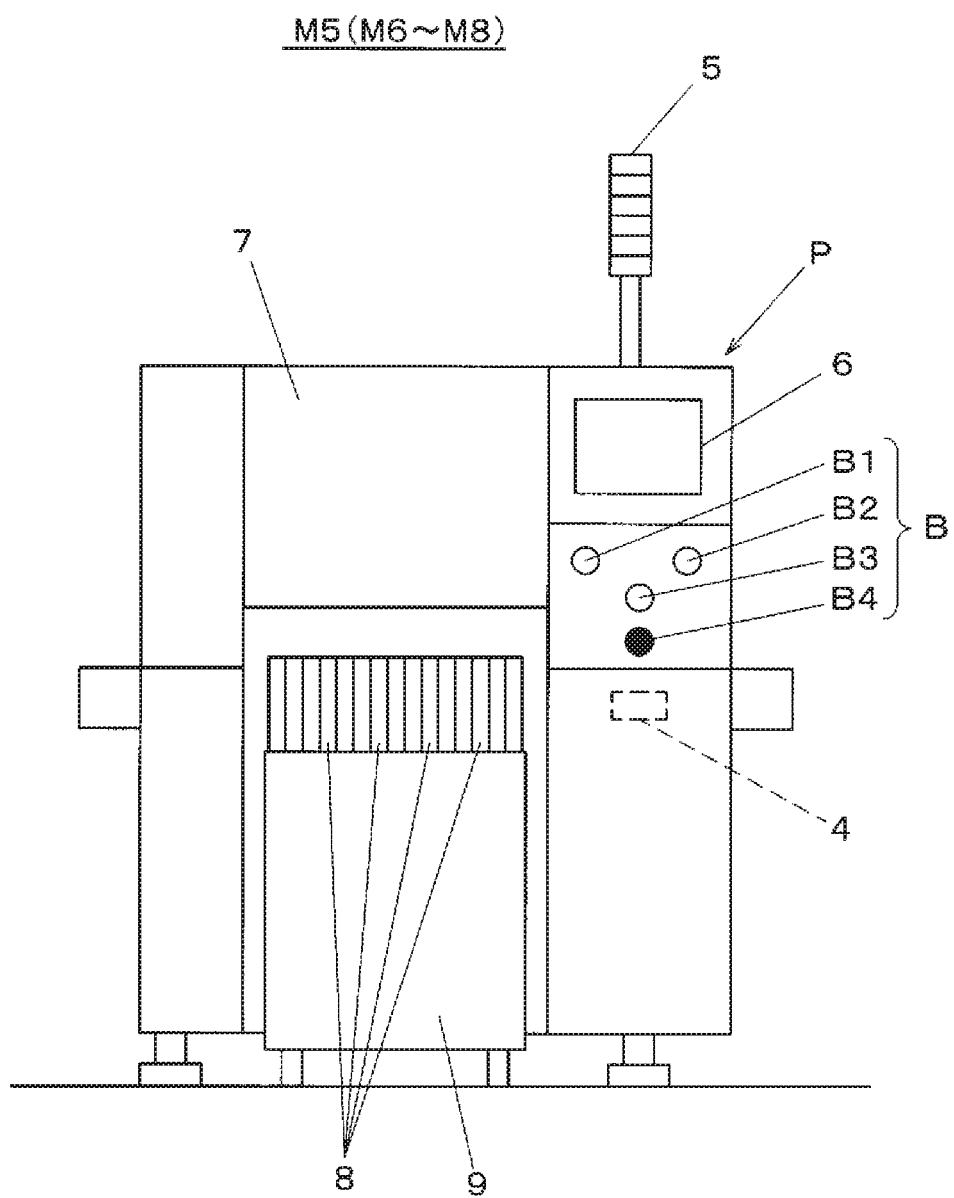
FIG. 2 is an explanatory diagram illustrating a configuration of a component mounting device in the component mounting system according to the exemplary embodiment of the present disclosure.

Hereinafter, configurations of component mounting devices M5 to M8 will be described with reference to FIG. 2. Component mounting devices M5 to M8 are similar in configuration to one another, and only component mounting device M5 will be described below. Component mounting device M5 has built-in device buzzer 4 and signal tower 5 is provided on an upper surface of component mounting device M5. Operation panel P is disposed in an upper right portion of a front surface of component mounting device M5, where the field worker performs a field work. Touch panel 6 and various operation buttons B are disposed on operation panel P. Touch panel 6 has a display function for displaying an operation screen for component mounting device M5 and the like in a liquid crystal panel and an input function for input of a command, various types of information, and the like based on an operation of the displayed operation screen.

Operation buttons B include start button B1, stop button B2, acquisition button B3, and emergency stop button B4. Once start button B1 is operated, component mounting device M5 initiates the component mounting work (operation). Once stop button B2 is operated, component mounting device M5 stops the component mounting work (operation). Once acquisition button B3 is operated, on-site operation right RL (described later) is acquired and an on-site operation such as an operation of component mounting device M5 based on touch panel 6 becomes possible. Once emergency stop button B4 is operated, power supply to component mounting device M5 is disconnected and component mounting device M5 is emergency-stopped.

Safety cover 7 for protection is provided in a central upper portion of the front surface of component mounting device M5 and safety cover 7 is for the field worker not to touch by mistake movable portions, such as a mounting head (not illustrated) placing the component onto the board and a head movement mechanism (not illustrated) for a horizontal movement of the mounting head, while component mounting device M5 is in operation. A sensor (not illustrated) detecting opening and closing of the safety cover is disposed in component mounting device M5 and the opening and closing of the safety cover is monitored with an output signal from the sensor.

Batch replacement carriage 9, which holds a plurality of tape feeders 8 (component supply devices) in parallel thereon, is installed in a central lower portion of the front surface of component mounting device M5 (below safety cover 7). Tape feeder 8 supplies component mounting device M5 with the component housed in a component supply tape.

Tape feeders 8 held by batch replacement carriage 9 and component mounting device M5 are electrically connected in a state where batch replacement carriage 9 is installed in component mounting device M5. A state of attachment and detachment of tape feeder 8 to and from component mounting device M5 is monitored based on an electrical connection state between component mounting device M5 and tape feeder 8.

Batch replacement carriage 9 can be attached to or detached from component mounting device M5. The field worker performs the following preparation work on batch replacement carriage 9 in a state where batch replacement carriage 9 is removed from component mounting device M5, the preparation work being for installation of tape feeders 8 supplying the component used for the component mounting work. During a change in setup of component mounting line L1, the field worker can batch-replace tape feeders 8 by removing installed batch replacement carriage 9 and installing prepared batch replacement carriage 9. A sensor (not illustrated) detecting the attachment and detachment of batch replacement carriage 9 is disposed in component mounting device M5 and a state of the attachment and detachment of batch replacement carriage 9 is monitored with an output signal from the sensor.

Tape feeder 8 can be replaced even in a state where batch replacement carriage 9 is installed in component mounting device M5. In this manner, the mounting head, the head movement mechanism, and tape feeders 8 constitute the component mounting working unit in component mounting device M5, the component mounting working unit executing the component mounting work for component placement on the board.

Hereinafter, a configuration of a control system for component mounting system 1 will be described with reference to FIG. 3. The following description will cover a control system for processing devices MP executing the works for component mounting in component mounting system 1 and management computer 3 connected to component mounting line L1 by communication network 2 and performing an overall control on component mounting system 1 with processing devices MP being connected to constitute component mounting line L1. Solder printing device M2, post-solder printing inspection device M3, component mounting devices M5 to M8, post-component mounting inspection device M10, and reflow device M11, which are processing devices MP, constitute similar control systems except that working units 21 executing the works for component mounting are the solder printing working unit, the post-solder printing inspection working unit, the component mounting working unit, the post-component mounting inspection working unit, and the board heating unit, respectively. In the following description, component mounting device M5 will be described as a representative of processing devices MP.

Processing device MP (component mounting device M5) has work control unit 20, working unit 21, device storage unit 22, device monitoring unit 23, device side notification control unit 24, input unit 25, display unit 26, device buzzer 4, signal tower 5, and communication unit 27. Work control unit 20 controls the work for component mounting by processing device MP by controlling working unit 21 based on data for component mounting stored in device storage unit 22. In other words, work control unit 20 controls the solder printing work in solder printing device M2, the post-solder printing inspection work in post-solder printing inspection device M3, the component mounting works in component mounting devices M5 to M8, and the post-component mounting inspection work in post-component mounting inspection device M10.

Device storage unit 22 stores error information 22a and operation right information 22b in addition to the data for component mounting. Information on whether that processing device MP holds on-site operation right RL or management computer 3 holds remote operation right RR is stored in operation right information 22b. On-site operation right RL refers to a right with which the field worker can perform the on-site operation in that processing device MP. Remote operation right RR refers to a right with which a remote worker can remotely operate processing device MP at management computer 3 (management device) and via communication network 2, the remote worker mainly performing an operation work at management computer 3 away from processing device MP.

Device monitoring unit 23, which monitors an operation state of working unit 21 of processing device MP, an inspection result, output signals from various sensors, and the like, stores the device error in error information 22a and transmits the device error to management computer 3 via communication unit 27 once the device error is detected. Examples of the device error in component mounting device M5 include a component shortage error that occurs when the component supplied by tape feeder 8 is used up, a board position deviation error that occurs when the transported board stops at a position deviating from a predetermined board stop position, and a component recognition error that occurs during non-detection of a component expected to be held by a suction nozzle. Those detected as the device errors include a solder inspection error in post-solder printing inspection device M3 and a mounting inspection error in post-component mounting inspection device M10, the former occurring when the printed solder is not in compliance with a predetermined shape standard and the latter occurring when the component is not at a predetermined position on the board.

In addition, device monitoring unit 23 monitors whether a predetermined specific operation set in advance with respect to the processing device has been performed or not. When it comes to component mounting device M5, the specific operation is an operation relating to safety of the field worker, examples of which include the opening and closing of safety cover 7, the operation of stop button B2, the operation of emergency stop button B4, an attachment and detachment operation for installed tape feeder 8 (component supply device), and an attachment and detachment operation for batch replacement carriage 9. Once the specific operation is detected, device monitoring unit 23 transmits a signal for reporting to that effect to management computer 3 via communication unit 27.

Device side notification control unit 24 controls notification operations by device buzzer 4 and signal tower 5 in accordance with a notification pattern transmitted from management computer 3. Device side notification control unit 24 performs the sound-based notification by controlling device buzzer 4 (first notification unit). Processing device MP may have a chime, a siren, or the like as the first notification unit insofar as it is capable of performing the sound-based notification. In addition, device side notification control unit 24 performs the visual expression-based notification (such as the turning on, turning off, and blinking of the signal lamp) by controlling signal tower 5 (second notification unit). Furthermore, device side notification control unit 24 is capable of performing the visual expression-based notification by controlling display unit 26, examples of which include blinking of a display screen of display unit 26. Processing device MP may have a revolving light, a flash lamp, or the like as the second notification unit insofar as it is capable of performing the visual expression-based notification.

Regarding the specific operation, device side notification control unit 24 performs the notification by signal tower 5 (second notification unit) without performing the notification by device buzzer 4 (first notification unit) once a first notification pattern instructed by management computer 3 is received during notification of remote response error ER (described later). During notification of on-site response error EL (described later), device side notification control unit 24 performs the notification by each of device buzzer 4 (first notification unit) and signal tower 5 (second notification unit) once a second notification pattern instructed by management computer 3 is received.

Input unit 25, which is an input device such as a keyboard, a touch panel, and a mouse, is used during operation command and data input by the field worker. In component mounting device M5, input unit 25 is the input function of touch panel 6. Display unit 26, which is a display device such as a liquid crystal panel, performs display of various screens such as an operation screen for the on-site operation by input unit 25. In component mounting device M5, display unit 26 is the display function of touch panel 6. Communication unit 27, which is a communication interface, performs signal exchange with other processing devices MP and management computer 3 via communication network 2 (network).

Figure 3:
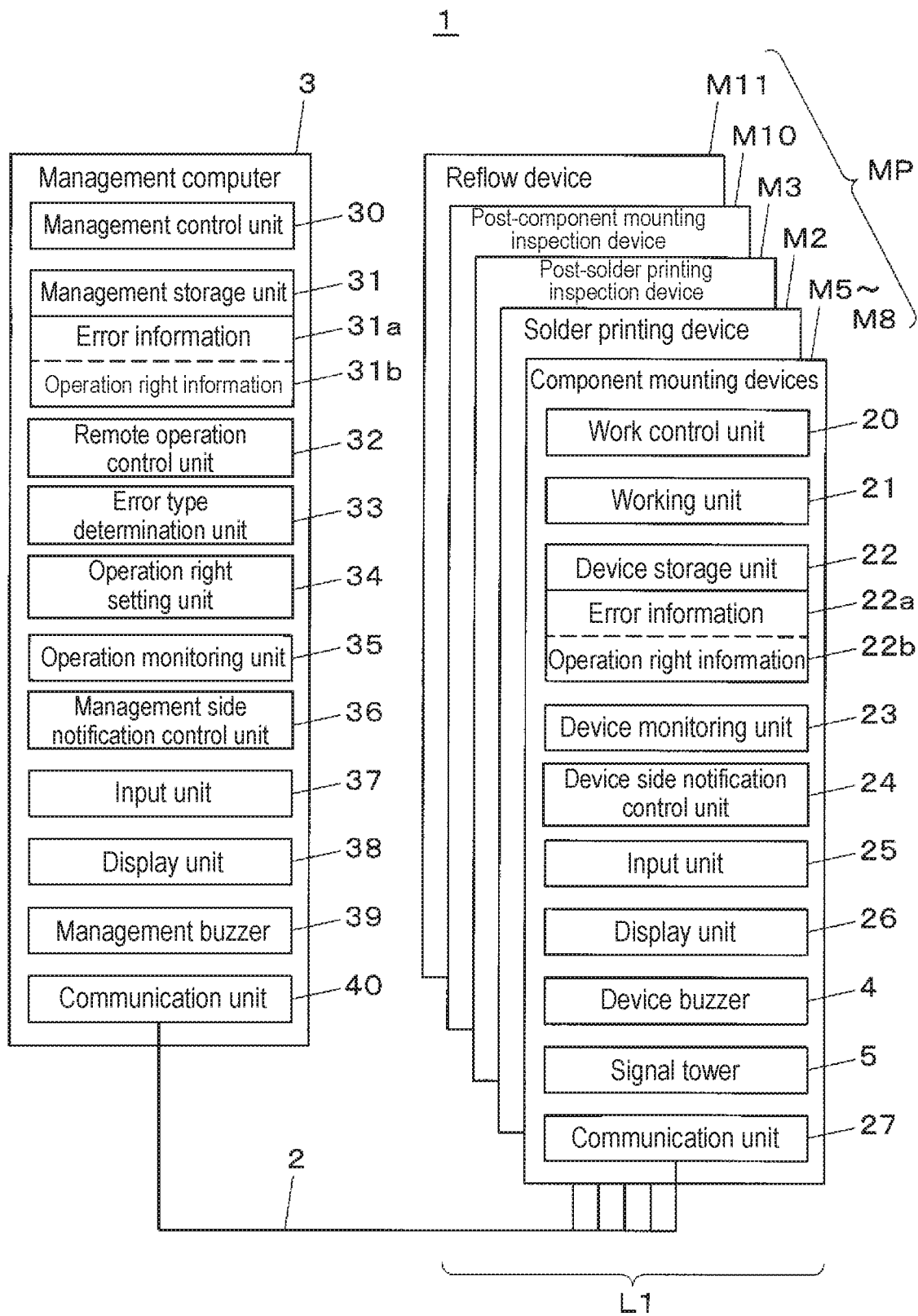
FIG. 3 is a block diagram illustrating a configuration of a control system for the component mounting system according to the exemplary embodiment of the present disclosure.

Management computer 3 in FIG. 3 has management control unit 30, management storage unit 31, remote operation control unit 32, error type determination unit 33, operation right setting unit 34, operation monitoring unit 35, management side notification control unit 36, input unit 37, display unit 38, management buzzer 39, and communication unit 40. Input unit 37, which is an input device such as a keyboard, a touch panel, and a mouse, is used during operation command and data input, the remote operation of processing device MP, and the like. Display unit 38, which is a display device such as a liquid crystal panel, displays not only various types of data but also an operation screen of each processing device MP for the remote operation and the like. Management buzzer 39 functions to notify the remote worker of the device error of processing device MP and the like by using a sound. Communication unit 40, which is a communication interface, performs signal and data exchange with processing device MP via communication network 2.

Management control unit 30, which is a calculation device such as a CPU, controls component mounting system 1 based on information stored by management storage unit 31. Management storage unit 31, which is a storage device, stores error information 31a and operation right information 31b as well as component mounting data. The device error occurring in each processing device MP and detected and transmitted by device monitoring units 23 of respective processing devices MP is stored in error information 31a in association with respective processing devices MR. Information on whether that processing device MP holds on-site operation right RL or management computer 3 holds remote operation right RR, for that processing device MP is stored in operation right information 31b with regard to each processing device MP.

Remote operation control unit 32 displays the operation screen of each processing device MP in display unit 38 of management computer 3 with respect to the plurality of processing devices MP holding remote operation right RR and controls those processing devices MP via communication network 2 such that those processing devices MP can be remotely controlled by input unit 37 of management computer 3. In other words, remote operation control unit 32 allows each of the plurality of processing devices MP to be remotely controlled via communication network 2 (network) by input unit 37 (input unit) in management computer 3 (management device).

Figure 4:
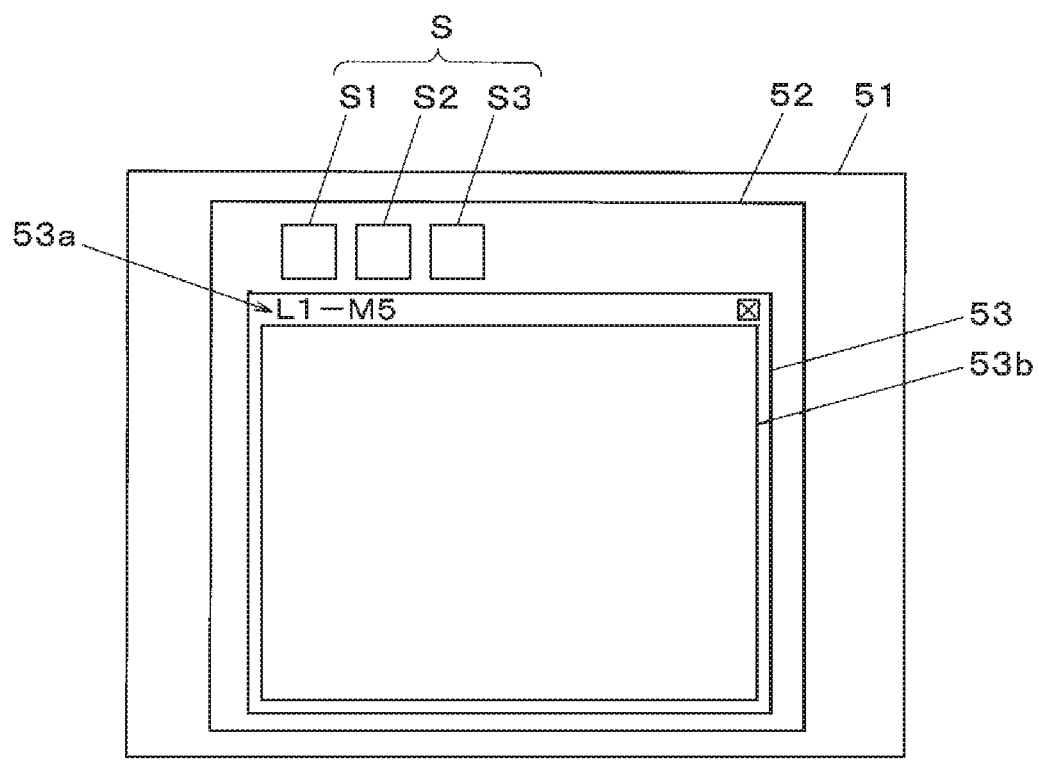
FIG. 4 is an explanatory diagram illustrating an example of a remote operation screen displayed by a management computer in the component mounting system according to the exemplary embodiment of the present disclosure.

An example of the operation screen of processing device MP for the remote operation that is displayed in display unit 38 of management computer 3 will be described below with reference to FIG. 4. Operation screen 52 for the remote operation of component mounting device M5 in component mounting line L1 is displayed on display screen 51 of display unit 38 according to FIG. 4. Screen display frame 53 and various remote operation switches S are displayed on operation screen 52. Character 53a ("L1-M5" herein) identifying processing device MP subjected to the remote operation is displayed in an upper left portion of screen display frame 53. The same screen information as screen information displayed on touch panel 6 (refer to FIG. 2) of component mounting device M5 is displayed in screen display region 53b in screen display frame 53.

Remote operation switches S include remote start switch S1, remote stop switch S2, and remote acquisition switch S3. Remote operation switches S correspond to respective operation buttons B of component mounting device M5. In other words, an operation similar to that performed during the operation of start button. B1 in component mounting device M5 is executed once remote start switch S1 displayed on operation screen 52 is operated by input unit 37 of management computer 3. Likewise, an operation similar to that performed during the operation of stop button. B2 is executed in component mounting device M5 once remote stop switch S2 is operated and an operation similar to that performed during the operation of acquisition button B3 is executed in component mounting device M5 once remote acquisition switch S3 is operated.

The remote worker can remotely operate component mounting device M5 (processing device MP) by operating the operation screen for component mounting device M5 and each of remote operation switches S displayed on operation screen 52 of management computer 3 with input unit 37 (input unit) of management computer 3 (management device). As described above, component mounting system 1 includes component mounting line L1, in which the plurality of processing devices MP are connected to constitute component mounting line L1, and the management device (management computer 3) connected to component mounting line L1 by the network (management network 2) and each of the plurality of processing devices MP can be remotely operated via the network by the input unit (input unit 37) of the management device.

Error type determination unit 33 in FIG. 3 determines the type of the device error (error) occurring in processing device MP, such as whether the device error of each processing device MP stored in error information 31a is remote response error ER or on-site response error EL. Remote response error ER is a device error to which the remote worker can respond by the remote operation based on management computer 3. On-site response error EL is a device error that can be responded to only by the field worker performing the on-site operation on processing device MP, examples of which include a device error entailing the opening and closing of safety cover 7 and a device error entailing attachment and detachment of the component supply device in error processing. In other words, error type determination unit 33 determines whether or not the device error (error) occurring in processing device MP is remote response error ER, which is an error of a target that is responded to by the remote operation based on management computer 3 (management device).

Remote response errors ER occurring in component mounting devices M5 to M8 include the board position deviation error imaged and recognized by a board recognition camera and the component recognition error imaged and recognized by a component recognition camera. Remote response error ER occurring in post-solder printing inspection device M3 includes the solder inspection error imaged and recognized by the solder inspection camera. Remote response error ER occurring in post-component mounting inspection device M10 includes the mounting inspection error imaged and recognized by the component inspection camera. These remote response errors ER can be eliminated by the same images as images captured by the respective cameras and displayed in display units 26 of respective processing devices MP being displayed in display unit 38 of management computer 3 and the remote worker performing an appropriate remote operation after grasping the situation.

On-site response errors EL occurring in component mounting devices M5 to M8 include the component shortage error regarding tape feeder 8. On-site response error EL also includes a device error previously determined as remote response error ER but changed into on-site response error EL based on a determination by the remote worker. Examples thereof include a case where the component recognition error that used to be remote response error ER is changed into on-site response error EL by the remote worker viewing an image displayed in display unit 38 of management computer 3 and determining it as a component drop error in which the component is not held by the suction nozzle and a field work is required due to a possibility of the component being dropped in component mounting devices M5 to M8.

Operation right setting unit 34 in FIG. 3 updates operation right information 31b of management computer 3 and operation right information 22b of processing device MP based on the type of the device error determined by error type determination unit 33. Specifically, operation right setting unit 34 updates operation right information 31b of management computer 3 and operation right information 22b of processing device MP by setting remote operation right RR of management computer 3 with respect to that processing device MP in a case where the device error determined by error type determination unit 33 is remote response error ER.

In other words, operation right setting unit 34 has a function of setting remote operation right RR with respect to management computer 3 (management device), remote operation right RR allowing a state to be achieved where the remote operation of processing device MP can be performed by input unit 37 (input unit) of management computer 3 (management device), and operation right setting unit 34 sets remote operation right RR with respect to management computer 3 (management device) in a case where the error determined by error type determination unit 33 is remote response error ER.

In a case where the device error determined by error type determination unit 33 is on-site response error EL, operation right setting unit 34 releases remote operation right RR of management computer 3 with respect to that processing device MP. Then, operation right setting unit 34 sets on-site operation right RL for that processing device MP and updates operation right information 31b of management computer 3 and operation right information 22b of processing device MP.

In the case of a request for an operation (on-site operation) by input unit 25 (input unit) of processing device MP based on, for example, an operation of acquisition button B3 of processing device MP in a state where remote operation right RR is set with respect to management computer 3 (management device), operation right setting unit 34 releases remote operation right RR set with respect to management computer 3 (management device). Then, operation right setting unit 34 sets on-site operation right RL for that processing device MP and updates operation right information 31b of management computer 3 and operation right information 22b of processing device MP.

In a case where it is detected by device monitoring unit 23 of processing device MP that the specific operation set in advance with respect to processing device MP has been performed in a state where remote operation right RR is set with respect to management computer 3 (management device), operation right setting unit 34 releases remote operation right RR set with respect to management computer 3 (management device). Then, operation right setting unit 34 sets on-site operation right RL for that processing device MP and updates operation right information 31b of management computer 3 and operation right information 22b of processing device MP.

While remote operation right RR is set for management computer 3, operation monitoring unit 35 in FIG. 3 measures and monitors idle time TA during which the remote worker executes no remote operation based on management computer 3 with respect to processing device MP, that is, the length of time elapsed since a final remote operation. Once idle time TA exceeds predetermined time, operation right setting unit 34 releases remote operation right RR, set with respect to that processing device MP. In other words, operation right setting unit 34 releases remote operation right RR, in a case where no remote operation based on management computer 3 (management device) is performed for a predetermined period of time (predetermined idle time TA). Then, operation right setting unit 34 sets on-site operation right RL for that processing device MP and updates operation right information 31b of management computer 3 and operation right information 22b of processing device MP.

Management side notification control unit 36 provides an instruction regarding a predetermined notification pattern for device side notification control unit 24 of processing device MP and controls notification operations by management buzzer 39 and display unit 38 of management computer 3 based on the device error determined by error type determination unit 33. Management side notification control unit 36 performs the sound-based notification by controlling management buzzer 39 (third notification unit). Management computer 3 may have a chime, a siren, or the like as the third notification unit insofar as it is capable of performing the sound-based notification.

In addition, management side notification control unit 36 performs the visual expression-based notification, such as blinking of display screen 51 of display unit 38 in whole or in part, by controlling display unit 38 (fourth notification unit). Management computer 3 may have a signal tower, a revolving light, a flash lamp, or the like as the fourth notification unit insofar as it is capable of performing the visual expression-based notification.

Regarding the specific operation, once it is determined by error type determination unit 33 that the device error is remote response error ER, management side notification control unit 36 provides an instruction of the first notification pattern for device side notification control unit 24 of processing device MP in which the device error has occurred. Then, management side notification control unit 36 performs the notification by each of management buzzer 39 (third notification unit) and display unit 38 (fourth notification unit).

Once it is determined by error type determination unit 33 that the device error is not remote response error ER but on-site response error EL, management side notification control unit 36 provides an instruction of the second notification pattern for device side notification control unit 24 of processing device MP in which the device error has occurred. Then, management side notification control unit 36 performs neither the notification by management buzzer 39 (third notification unit) nor the notification by display unit 38 (fourth notification unit).

In this manner, device buzzer 4 (first notification unit) and signal tower 5 (second notification unit) of processing device MP and management buzzer 39 (second notification unit) and display unit 38 (fourth notification unit) of management computer 3 are notification units AM notifying of the occurrence of the error in processing device MP based on a result of the determination by error type determination unit 33. Notification units AM perform the notification in the first notification pattern in a case where the error occurring in processing device MP is remote response error ER and perform the notification in the second notification pattern in a case where the error is not remote response error ER but on-site response error EL.

In other words, notification units AM have at least the first notification unit (device buzzer 4) disposed in each processing device MP and performing the sound-based notification and second notification unit (signal tower 5) disposed in each processing device MP and performing the visual expression-based notification, and the notification by the second notification unit is performed and the notification by the first notification unit is not performed in the first notification pattern whereas the notification is performed by each of the first notification unit and the second notification unit in the second notification pattern.

Notification units AM also have the third notification unit (management buzzer 39) disposed in the management device (management computer 3) and performing the sound-based notification and the fourth notification unit (display unit 38) disposed in the management device (management computer 3) and performing the visual expression-based notification, and the notification is performed by each of the third notification unit and the fourth notification unit in the first notification pattern whereas neither the notification by the third notification unit nor the notification by the fourth notification unit is performed in the second notification pattern.

Figure 5:
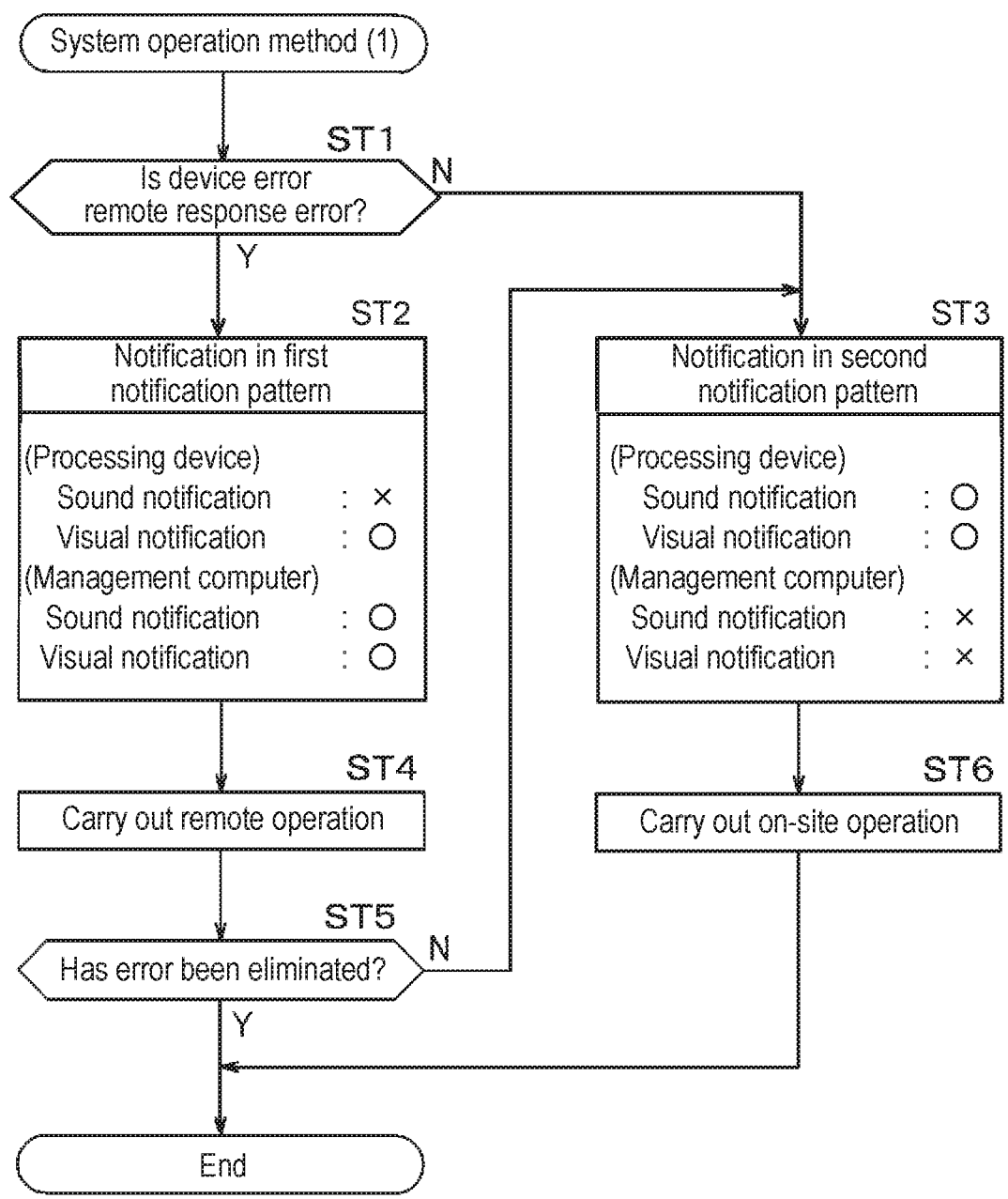
FIG. 5 is a flowchart showing a first example of a system operation method for the component mounting system according to the exemplary embodiment of the present disclosure.

Hereinafter, a first example of a component mounting method for component mounting system 1, which is a system operation method for appropriately operating management computer 3 and processing device MP in response to the device error occurring in processing device MP, will be described with reference to a flow illustrated in FIG. 5. The first example of the system operation method is an appropriate notification control method for device error response. Once the device error is detected by device monitoring unit 23 of processing device MP, error type determination unit 33 of management computer 3 determines whether or not the device error is remote response error ER (ST1: error type determination process). In other words, error type determination unit 33 determines whether or not the device error occurring in processing device MP is remote response error ER, which is the device error of the target that is responded to by the remote operation based on the management device (management computer 3).

In a case where the type of the device error is remote response error ER (Yes in ST1), notification units AM perform the notification in the first notification pattern (ST2: first notification process). Specifically notification units AM do not perform the notification by device buzzer 4 (first notification unit) of processing device MP, perform the notification by signal tower 5 (second notification unit), and perform the notification by management buzzer 39 (third notification unit) and display unit 38 (fourth notification unit) of management computer 3. In other words, in the first notification pattern, processing device MP performs the visual expression-based notification without performing the sound-based notification and management computer 3 (management device) performs the sound-based notification and the visual expression-based notification.

In a case where the type of the device error is not remote response error ER but on-site response error EL, (No in ST1), notification units AM perform the notification in the second notification pattern (ST3: second notification process). Specifically notification units AM perform the notification by device buzzer 4 (first notification unit) and signal tower 5 (second notification unit) of processing device MP and perform neither the notification by management buzzer 39 (third notification unit) of management computer 3 nor the notification by display unit 38 (fourth notification unit) of management computer 3.

In other words, in the second notification pattern, processing device MP performs the sound-based notification and the visual expression-based notification whereas management computer 3 (management device) performs neither the sound-based notification nor the visual expression-based notification. Only the visual expression-based notification may be performed and the sound-based notification may not be performed in the second notification pattern as well. Even in this case, the remote worker can appropriately recognize the occurrence of not remote response error ER but on-site response error EL.

As described above, notification units AM perform the notification in the first notification pattern in a case where the type of the device error is remote response error ER and perform the notification in the second notification pattern in a case where the type of the device error is not remote response error ER based on the result of the device error type determination in the error type determination process (ST1).

After the device error notification in the first notification process (ST2), the remote operation with respect to processing device MP in which the device error has occurred is carried out by the remote worker noticing the notification in management computer 3 (ST4: remote operation process). Then, it is determined whether or not the device error in processing device MP has been eliminated through the remote operation by the remote worker (ST5: error elimination determination process). In other words, it is determined whether or not the device error has been removed from error information 31a stored in management storage unit 31 by the device error in processing device MP being eliminated by error type determination unit 33.

In a case where it is determined in the error elimination determination process (ST5) that the device error has not been eliminated (No), the process proceeds to the second notification process (ST3) and the notification in the second pattern is performed. In other words, processing device MP performs the notification in the second notification pattern in a case where the device error is remote response error ER and the device error has not been eliminated despite termination of the remote operation by the management device subsequent to the notification performed in the first notification pattern by the management device (management computer 3). In other words, notification units AM perform the notification in the second notification pattern in a case where the device error is remote response error ER and the device error has not been eliminated despite termination of the remote operation by the management device subsequent to the notification performed in the first notification pattern. Accordingly, a notification urging the field worker to perform the on-site operation can be appropriately carried out even in a case where the device error cannot be eliminated through the remote operation by the remote worker.

After the device error notification in the second notification process (ST3), the on-site operation with respect to processing device MP in which the device error has occurred is carried out by the field worker noticing the notification in processing device MP (ST6: on-site operation process). Accordingly, the device error elimination can be appropriately carried out through the on-site operation by the field worker even in a case where the device error cannot be eliminated through the remote operation by the remote worker.

In component mounting system 1, it is determined whether or not the device error occurring in processing device MP is remote response error ER as described above, and notification units AM perform the notification in the first notification pattern in a case where the device error is remote response error ER and perform the notification in the second notification pattern in a case where the device error is not remote response error ER. Therefore, an appropriate notification can be provided for the field worker or the remote worker supposed to deal with the device error with respect to processing device MP constituting component mounting line L1, and the on-site operation by the field worker and the remote operation by the remote worker can be appropriately performed.

Figure 6:
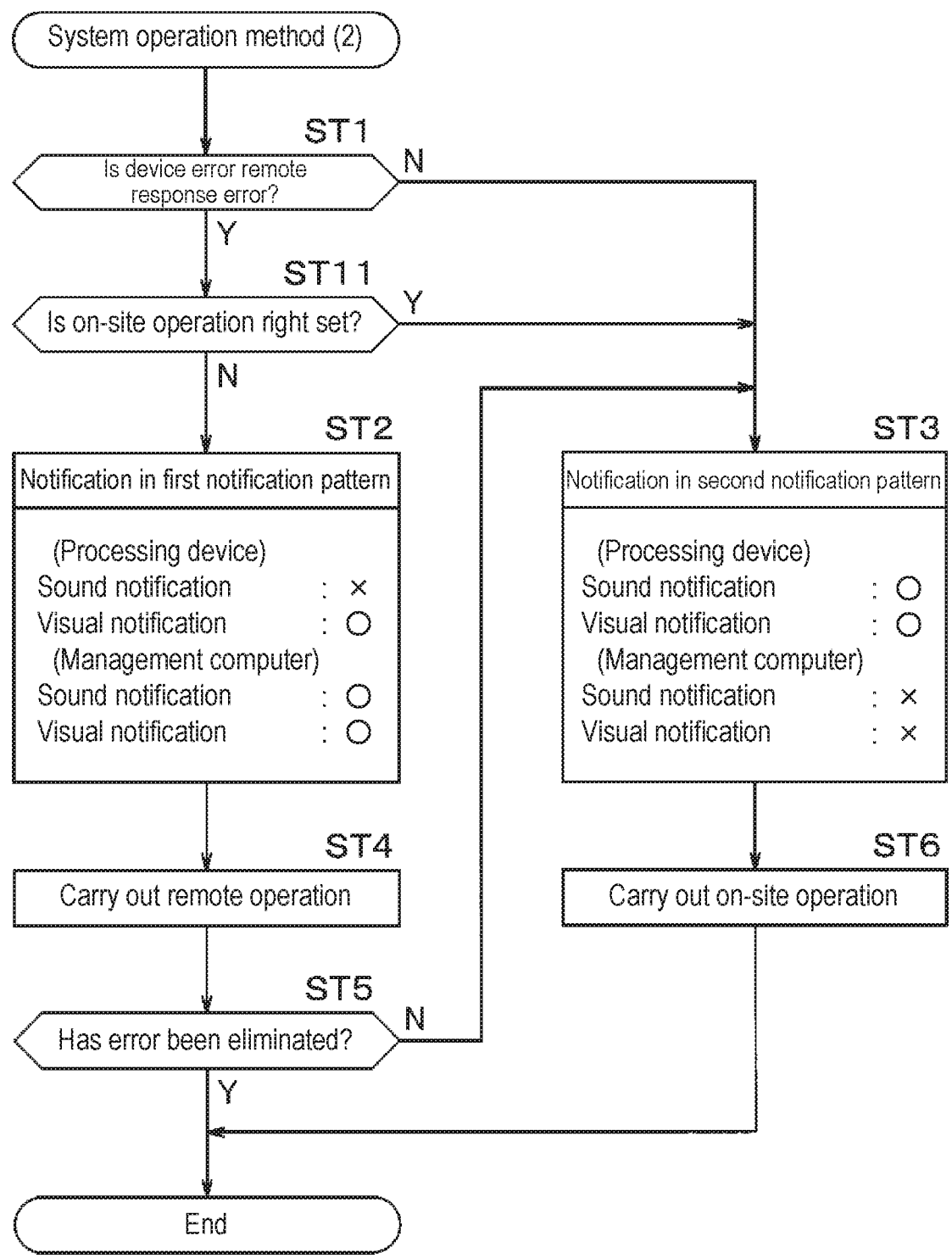
FIG. 6 is a flowchart showing a second example of the system operation method for the component mounting system according to the exemplary embodiment of the present disclosure.

Hereinafter, a second example of the component mounting method for component mounting system 1, which is a system operation method for appropriately operating management computer 3 and processing device MP in response to the device error occurring in processing device MP, will be described with reference to a flow illustrated in FIG. 6. The second example of the system operation method differs from the first example in that the notification pattern is determined based on the presence or absence of on-site operation right RL of processing device MP at a time when the device error has been detected. In the following description, the same reference numerals will be used to refer to processes common to the first and second examples so that the same detailed description does not have to be repeated.

Once the device error is detected by device monitoring unit 23 of processing device MP, error type determination unit 33 of management computer 3 determines whether or not the device error is remote response error ER (ST1: error type determination process). In a case where the type of the device error is remote response error ER (Yes in ST1), management side notification control unit 36 determines whether or not on-site operation right RL is set for processing device MP by referring to operation right information 31b stored in management storage unit 31 (ST11: on-site operation right determination process).

In a case where no on-site operation right RL is set for processing device MP (No in ST11), notification units AM perform the notification in the first notification pattern (ST2:

first notification process). In a case where on-site operation right RL is set for processing device MP (Yes in ST11), notification units AM perform the notification in the second notification pattern (ST3: second notification process). In other words, in a case where the device error is remote response error ER and input unit (input unit 25) of processing device MP is in operation at a time of the occurrence of the device error, notification units AM perform the notification in the second notification pattern.

In a case where it is determined in the error type determination process (ST1) that the type of the device error is not remote response error ER (No), notification units AM perform the notification in the second notification pattern (ST3: second notification process). After the device error notification in the first notification process (ST2), the remote operation with respect to processing device MP is carried out by the remote worker (ST4: remote operation process).

Then, it is determined whether or not the device error in processing device NIP has been eliminated through the remote operation (ST5: error elimination determination process). In a case where it is determined in the error elimination determination process (ST5) that the device error has not been eliminated (No), the process proceeds to the second notification process (ST3) and the notification in the second pattern is performed. After the device error notification in the second notification process (ST3), the on-site operation with respect to processing device MP is carried out by the field worker (ST6: on-site operation process).

In component mounting system 1, it is determined whether or not the device error occurring in processing device MP is remote response error ER as described above, and notification units AM perform the notification in the first notification pattern in a case where the device error is remote response error ER and perform the notification in the second notification pattern in a case where the device error is not remote response error ER. In a case where the device error is remote response error ER and input unit (input unit 25) of processing device MP is in operation at a time of the occurrence of the device error, notification units AM perform the notification in the second notification pattern.

In other words, in a case where the on-site operation is in progress in processing device MP, no notification is provided for the remote worker and a notification is provided for the field worker for response by the on-site operation even if the device error is remote response error ER. Therefore, an appropriate notification can be provided for the field worker or the remote worker supposed to deal with the device error with respect to processing device MP constituting component mounting line L1, and the on-site operation by the field worker and the remote operation by the remote worker can be appropriately performed.

Figure 7:
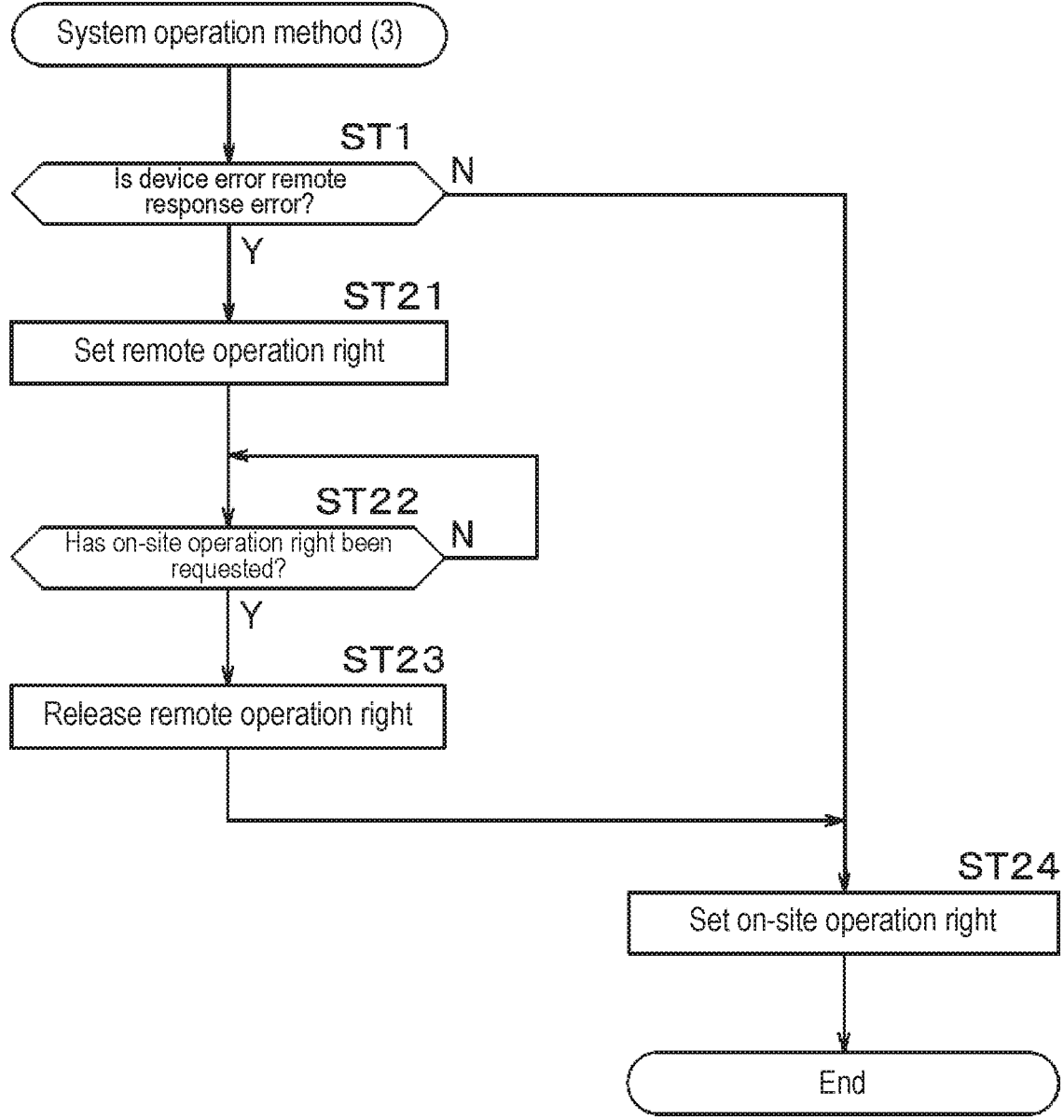
FIG. 7 is a flowchart showing a third example of the system operation method for the component mounting system according to the exemplary embodiment of the present disclosure.

Hereinafter, a third example of the component mounting method for component mounting system 1, which is a system operation method for appropriately operating management computer 3 and processing device MP in response to the device error occurring in processing device MP, will be described with reference to a flow illustrated in FIG. 7. The third example of the system operation method, which is an appropriate operation right control method for responding to the device error, differs from the first example in that remote operation right RR or on-site operation right RL is set for management computer 3 or processing device MP. In the following description, the same reference numerals will be used to refer to processes common to the first and third examples so that the same detailed description does not have to be repeated.

Once the device error is detected by device monitoring unit 23 of processing device MP, error type determination unit 33 of management computer 3 determines whether or not the device error is remote response error ER (ST1: error type determination process). In a case where the type of the device error is remote response error ER (Yes in ST1), operation right setting unit 34 sets remote operation right RR for management computer 3 (ST21: remote operation right setting process). In other words, in a case where the type of the device error is remote response error ER, operation right setting unit 34 sets remote operation right RR with respect to the management device (management computer 3), remote operation right RR allowing the state to be achieved where the remote operation of processing device MP can be performed by the input unit (input unit 37) of the management device.

Once on-site operation right RL is requested by acquisition button B3 of processing device MP being operated thereafter in a state where remote operation right RR is set with respect to management computer 3 in the remote operation right setting process (ST21) (Yes in ST22), operation right setting unit 34 releases remote operation right RR (ST23: remote operation right release process). In other words, operation right setting unit 34 sets remote operation right RR with respect to the management device, remote operation right RR allowing the state to be achieved where the remote operation of processing device MP can be performed by the input unit (input unit 37) of the management device (management computer 3). In the case of a request for an operation by the input unit (input unit 25) of processing device MP thereafter in a state where remote operation right RR is set with respect to the management device, remote operation right RR set for the management device is released.

Then, operation right setting unit 34 sets on-site operation right RL for processing device MP (ST24: on-site operation right setting process). In this manner, remote operation right RR is released and on-site operation right RL is set, once a request for on-site operation right RL is made by the field worker, even after remote operation right RR is set with the device error being determined as remote response error ER. Accordingly, the on-site operation by the field worker and the remote operation by the remote worker can be appropriately performed. In a case where it is determined in the error type determination process (ST1) that the type of the device error is not remote response error ER (No), the process proceeds to the on-site operation right setting process (ST24) and on-site operation right RL is set for processing device MP.

In component mounting system 1, it is determined whether or not the device error occurring in processing device MP is remote response error ER as described above, and remote operation right RR is set for the management device (management computer 3) in a case where the type of the device error is remote response error ER. Accordingly, on-site operation right RL or remote operation right RR can be appropriately set and the on-site operation by the field worker and the remote operation by the remote worker can be appropriately performed.

In addition, in component mounting system 1, remote operation right RR set for the management device is released in the case of an on-site operation request in a state where remote operation right RR is set for the management device (management computer 3). Accordingly, on-site operation right RL or remote operation right RR can be appropriately set and the on-site operation by the field worker and the remote operation by the remote worker can be appropriately performed.

Figure 8:
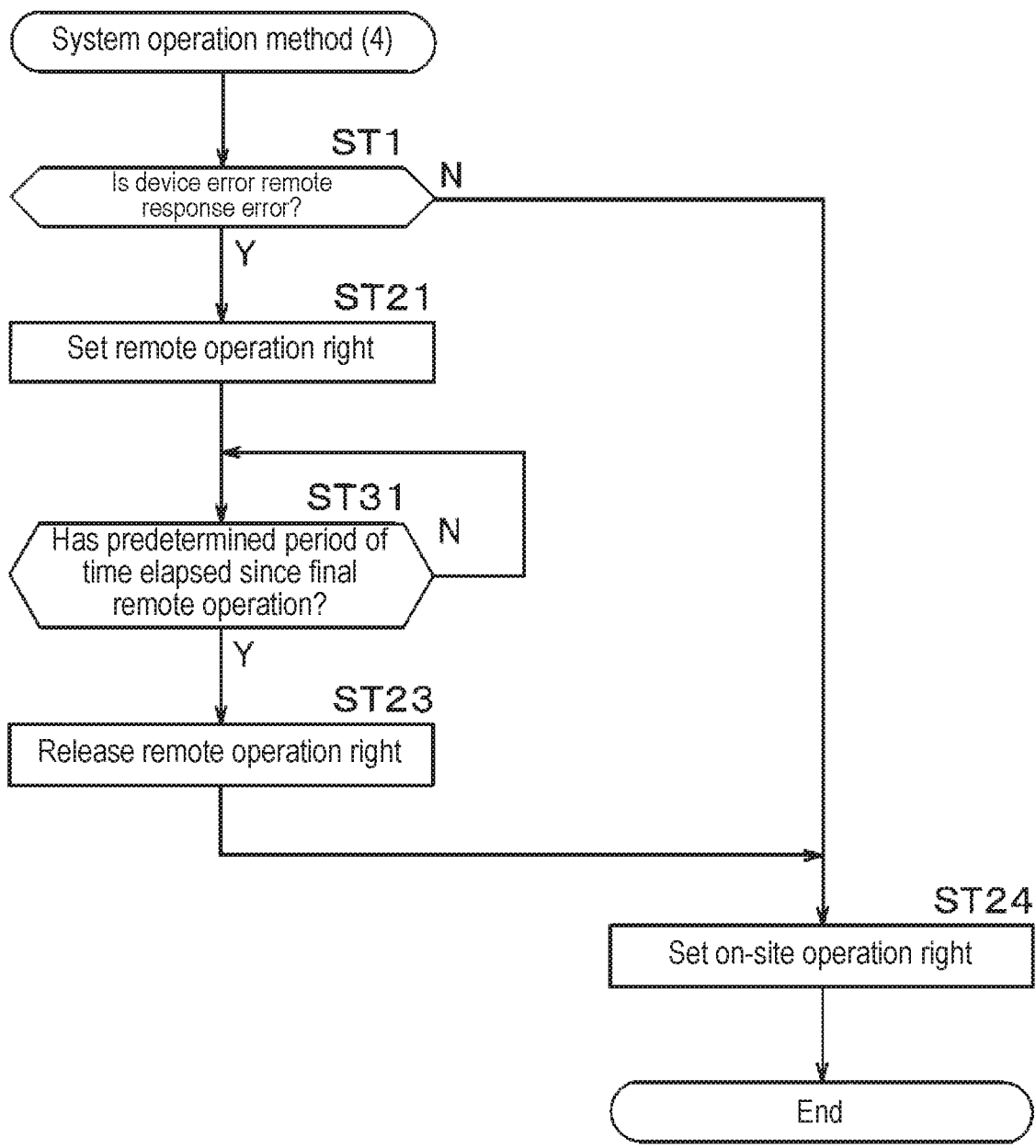
FIG. 8 is a flowchart showing a fourth example of the system operation method for the component mounting system according to the exemplary embodiment of the present disclosure.

Hereinafter, a fourth example of the component mounting method for component mounting system 1, which is a system operation method for appropriately operating management computer 3 and processing device MP in response to the device error occurring in processing device MP, will be described with reference to a flow illustrated in FIG. 8. The fourth example of the system operation method differs from the third example in that on-site operation right RL is set for processing device MP in a case where idle time TA exceeds the predetermined period of time in a state where remote operation right RR is set. In the following description, the same reference numerals will be used to refer to processes common to the first, third, and fourth examples so that the same detailed description does not have to be repeated.

Once the device error is detected by device monitoring unit 23 of processing device MP, error type determination unit 33 of management computer 3 determines whether or not the device error is remote response error ER (ST1: error type determination process). In a case where the type of the device error is remote response error ER (Yes in ST1), operation right setting unit 34 sets remote operation right RR for management computer 3 (ST21: remote operation right setting process).

Once it is detected by operation monitoring unit 35 that idle time TA has exceeded the predetermined period of time and the predetermined period of time has elapsed since the final remote operation in a state where remote operation right RR is set with respect to management computer 3 in the remote operation right setting process (ST21) (Yes in ST31), operation right setting unit 34 releases remote operation right RR (ST23: remote operation right release process). In other words, operation right setting unit 34 releases remote operation right RR in a case where no remote operation by the management device (management computer 3) is performed for the predetermined period of time in a state where remote operation right RR is set for management computer 3.

Then, operation right setting unit 34 sets on-site operation right RL for processing device MP (ST24: on-site operation right setting process). In this manner, remote operation right RR is released and on-site operation right RL is set, even after remote operation right RR is set with the device error being determined as remote response error ER, in a case where the remote operation by the remote worker is not performed for the predetermined period of time. Accordingly, the on-site operation by the field worker and the remote operation by the remote worker can be appropriately performed. In a case where it is determined in the error type determination process (ST1) that the type of the device error is not remote response error ER (No), the process proceeds to the on-site operation right setting process (ST24) and on-site operation right RL is set for processing device MP.

In component mounting system 1, it is determined whether or not the device error occurring in processing device MP is remote response error ER as described above, and remote operation right RR is set for the management device (management computer 3) in a case where the type of the device error is remote response error ER. Remote operation right RR, is released in a case where the remote operation based on the management device is not performed for the predetermined period of time. Accordingly, on-site operation right RL or remote operation right RR can be appropriately set and the on-site operation by the field worker and the remote operation by the remote worker can be appropriately performed.

Figure 9:
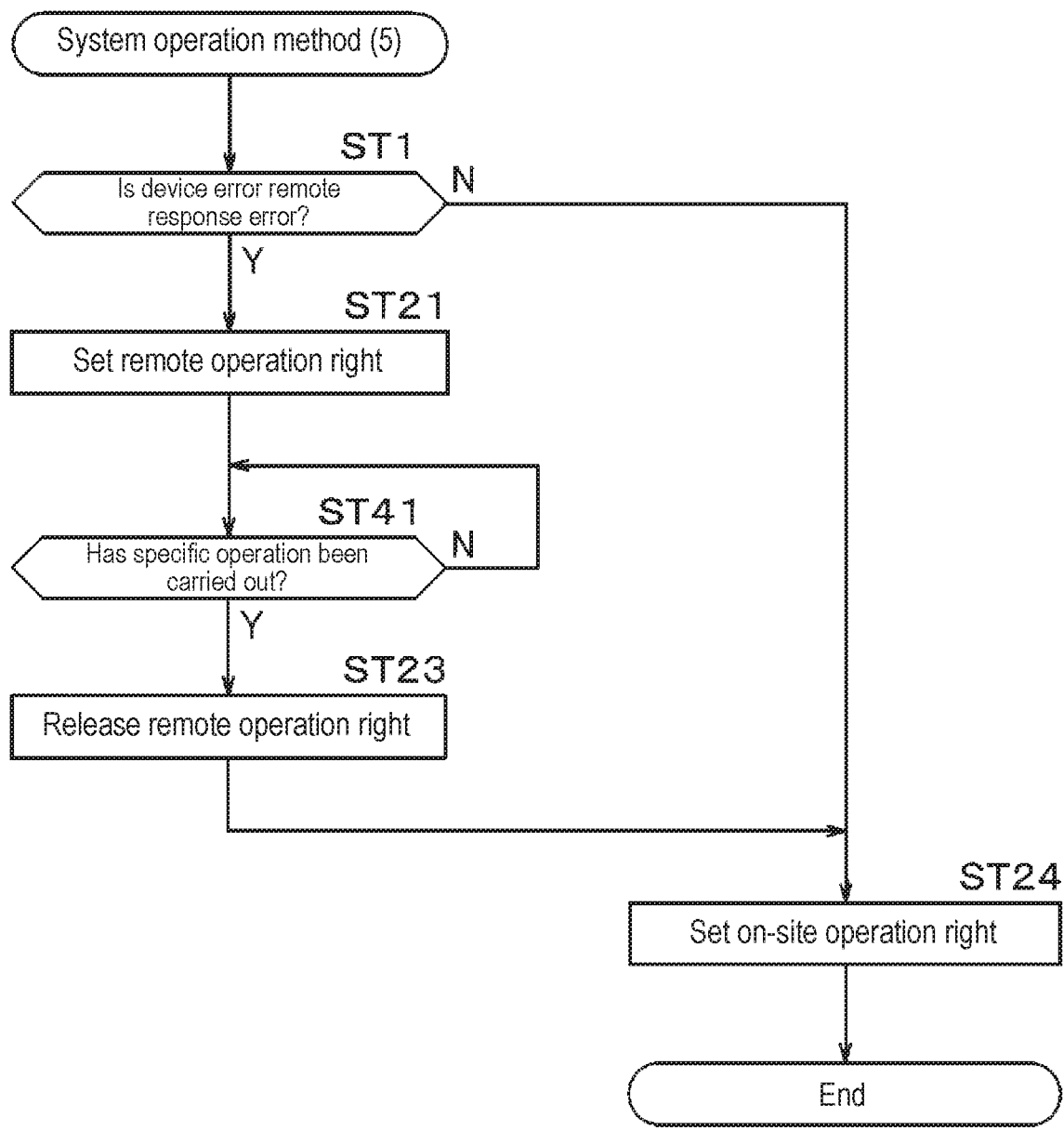
FIG. 9 is a flowchart showing a fifth example of the system operation method for the component mounting system according to the exemplary embodiment of the present disclosure.

Hereinafter, a fifth example of the component mounting method for component mounting system 1, which is a system operation method for appropriately operating management computer 3 and processing device MP in response to the device error occurring in processing device MP, will be described with reference to a flow illustrated in FIG. 9. The fifth example of the system operation method differs from the third example in that on-site operation right RL is set for processing device MP in a case where the specific operation has been performed in processing device MP in a state where remote operation right RR is set. In the following description, the same reference numerals will be used to refer to processes common to the first, third, and fifth examples so that the same detailed description does not have to be repeated.

Once the device error is detected by device monitoring unit 23 of processing device MP error type determination unit 33 of management computer 3 determines whether or not the device error is remote response error ER (ST1: error type determination process). In a case where the type of the device error is remote response error ER (Yes in ST1), operation right setting unit 34 sets remote operation right RR for management computer 3 (ST21: remote operation right setting process).

Once it is detected by device monitoring unit 23 that the specific operation set in advance in processing device MP has been carried out in a state where remote operation right RR is set with respect to management computer 3 in the remote operation right setting process (ST21) (Yes in ST41), operation right setting unit 34 releases remote operation right RR (ST23: remote operation right release process). In other words, operation right setting unit 34 releases remote operation right RR set for the management device (management computer 3) in a case where the specific operation set in advance has been performed with respect to processing device MP in a state where remote operation right RR is set with respect to the management device (management computer 3).

The predetermined specific operation is an operation relating to the safety of the field worker and is at least any one of the opening and closing of safety cover 7 of processing device MP (component mounting devices M5 to M8), the operation of stop button B2 of processing device MP, the attachment and detachment operation for tape feeder 8 (component supply device) or batch replacement carriage 9 installed in processing device MP.

Then, operation right setting unit 34 sets on-site operation right RL for processing device MP (ST24: on-site operation right setting process). In this manner, remote operation right RR, is released and on-site operation right RL is set, even after remote operation right RR is set with the device error being determined as remote response error ER, in a case where the predetermined specific operation has been performed in processing device MP. Accordingly, the on-site operation by the field worker and the remote operation by the remote worker can be appropriately performed. In a case where it is determined in the error type determination process (ST1) that the type of the device error is not remote response error ER (No), the process proceeds to the on-site operation right setting process (ST24) and on-site operation right RL is set for processing device MP.

In component mounting system 1, remote operation right RR set with respect to the management device is released as described above in a case where the specific operation set in advance has been performed with respect to processing device MP in a state where remote operation right RR is set with respect to the management device (management computer 3). Accordingly on-site operation right RL or remote operation right RR can be appropriately set and the on-site operation by the field worker and the remote operation by the remote worker can be appropriately performed.

Figure 10:
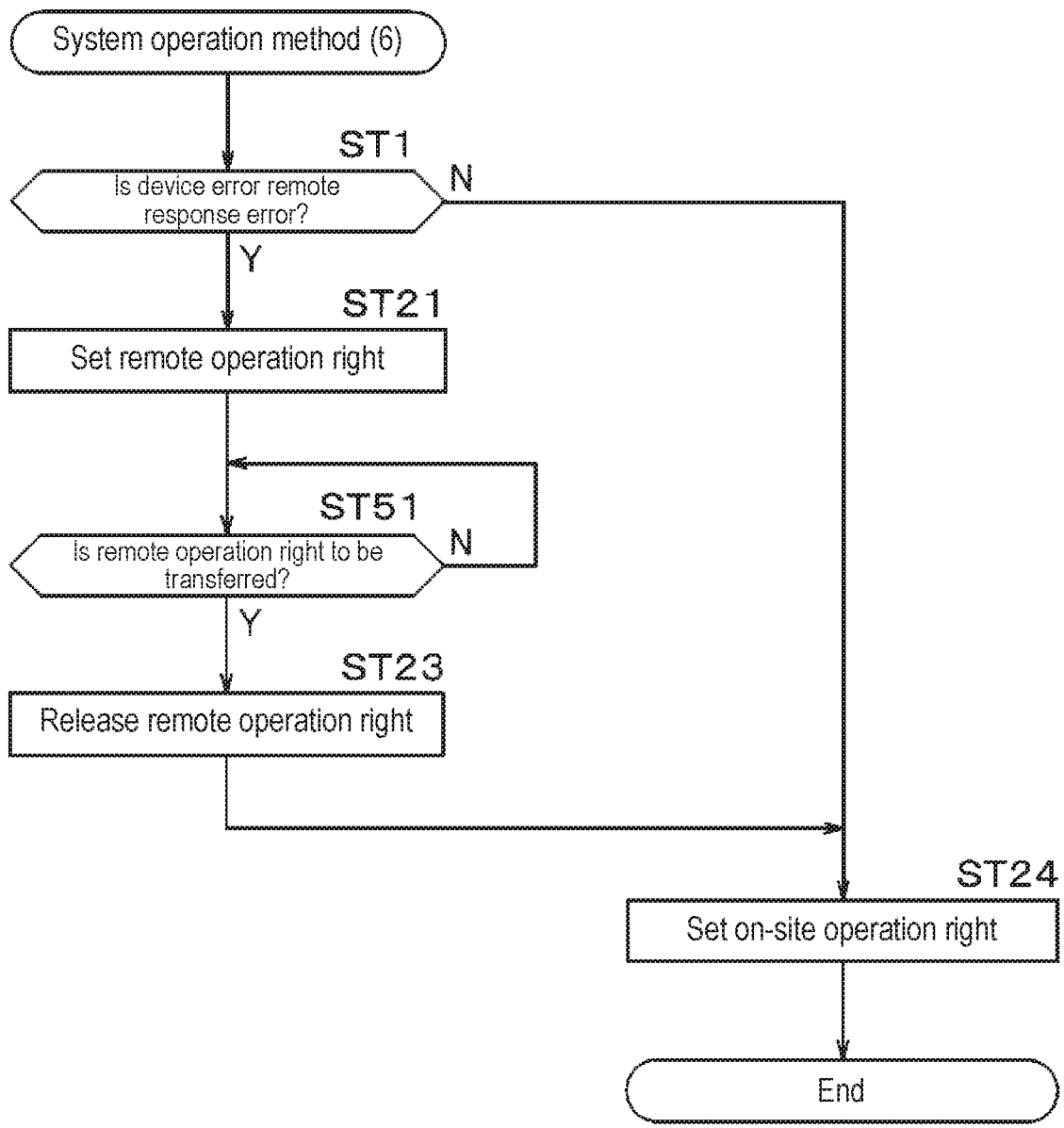
FIG. 10 is a flowchart showing a sixth example of the system operation method for the component mounting system according to the exemplary embodiment of the present disclosure.

Hereinafter, a sixth example of the component mounting method for component mounting system 1, which is a system operation method for appropriately operating management computer 3 and processing device MP in response to the device error occurring in processing device MP, will be described with reference to a flow illustrated in FIG. 10. The sixth example of the system operation method differs from the third example in that the remote worker in a state where remote operation right RR is set intentionally releases remote operation right RR set for himself or herself from management computer 3 side and sets on-site operation right RL for processing device MP in the Mowing description, the same reference numerals will be used to refer to processes common to the first, third, and sixth examples so that the same detailed description does not have to be repeated.

Once the device error is detected by device monitoring unit 23 of processing device MP, error type determination unit 33 of management computer 3 determines whether or not the device error is remote response error ER (ST1: error type determination process). In a case where the type of the device error is remote response error ER (Yes in ST1), operation right setting unit 34 sets remote operation right RR for management computer 3 (ST21: remote operation right setting process).

In a case where the remote worker is to transfer his or her operation right to processing device MP for a reason such as incapability of error elimination by the remote operation in a state where remote operation right RR is set with respect to management computer 3 in the remote operation right setting process (ST21), operation right setting unit 34 releases remote operation right RR through an operation (ST51) of management computer 3 by the remote worker (ST23: remote operation right release process).

Then, operation right setting unit 34 sets on-site operation right RL for processing device MP (ST24: on-site operation right setting process). By this operation being performed, the on-site operation by the field worker and the remote operation by the remote worker can be appropriately performed. In a case where it is determined in the error type determination process (ST1) that the type of the device error is not remote response error ER (No), the process proceeds to the on-site operation right setting process (ST24) and on-site operation right RL is set for processing device MP.

Figure 11:
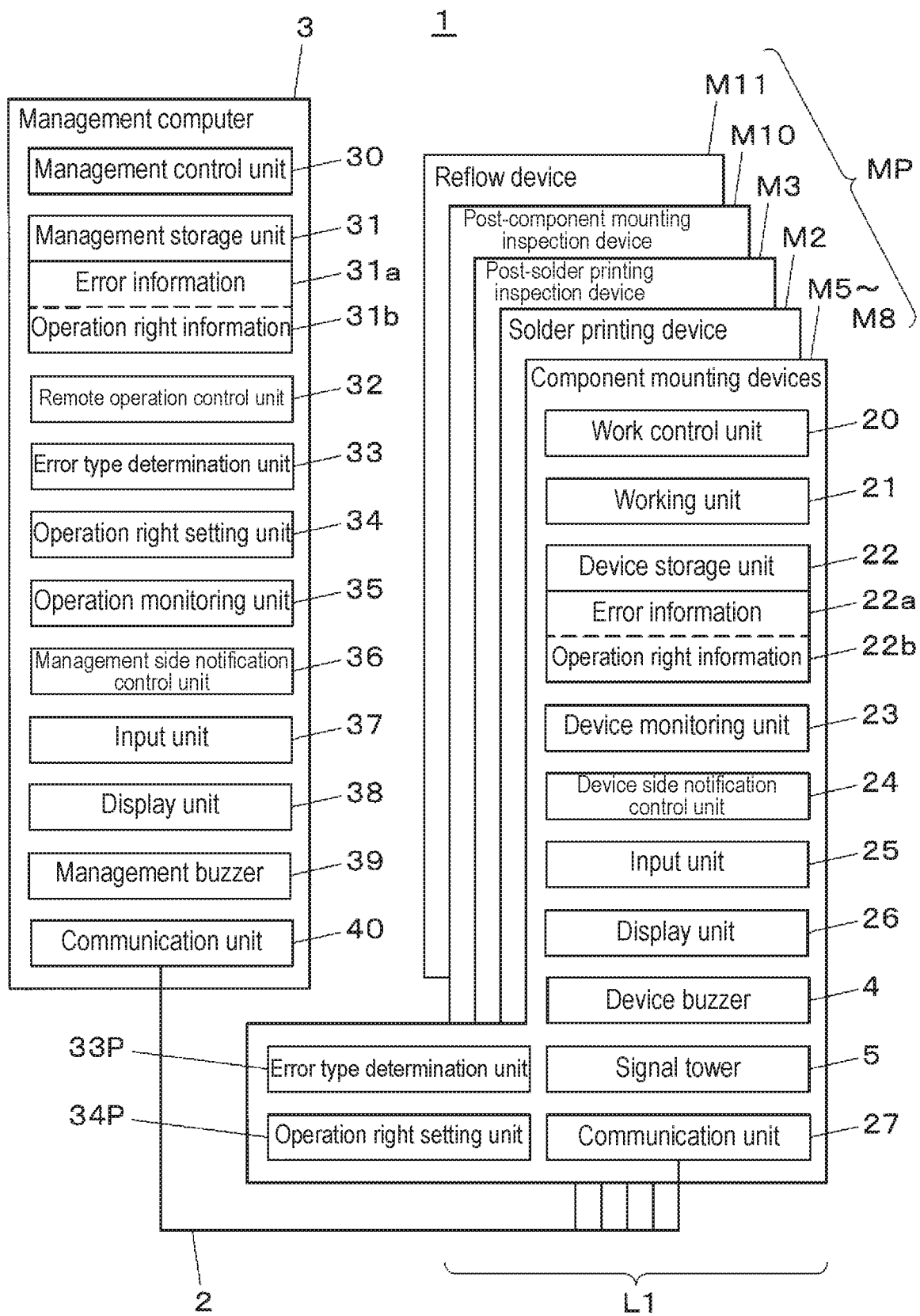
FIG. 11 is a block diagram illustrating a configuration of another example of the control system for the component mounting system according to the exemplary embodiment of the present disclosure.

Although an aspect in which error type determination unit 33 and operation right setting unit 34 are disposed only in management computer 3 has been described in the present exemplary embodiment, similar functions may also be provided in each processing device MP as error type determination unit 33P and operation right setting unit 34P as illustrated in FIG. 11. In addition, each processing device MP may perform the notification based on a notification pattern stored in device storage unit 22 of itself and based on a result of determination by error type determination unit 33P of itself with the notification pattern being stored in device storage unit 22 of itself while each processing device MP provides a notification pattern instruction for management computer 3 and sets the operation right by using operation right setting unit 34P if necessary.

In addition, each of respective processing devices MP and management computer 3 may perform determination with error type determination unit 33 or error type determination unit 33P of itself based on error information 31a and determine a notification pattern to be performed by itself.

According to the above description of the present exemplary embodiment, the power supply to processing device MP is disconnected and processing device MP is emergency-stopped once emergency stop button B4 is operated, but the present disclosure is not limited thereto and the operation of processing device MP may be stopped without, for example, the power supply being disconnected. Although tape feeder 8 has been described as the component supply device in the present exemplary embodiment, the present disclosure is not limited thereto and various types of component supply devices such as a tray feeder, a stick feeder, and a bowl feeder may take its place. These component supply devices may be directly attached to and detached from processing device NIP or may be attached to and detached from processing device MP via batch replacement carriage 9. As a matter of course, the specific operation includes the attachment and detachment of these component, supply devices.

The component mounting system and the component mounting method according to the present disclosure enable an appropriate on-site operation and an appropriate remote operation with respect to a processing device constituting a component mounting line and are useful in the field of component mounting for component mounting on boards.

What is claimed is:

1. A component mounting method for at least one processing device, the at least one processing device being at least one of a solder printing device, an inspection device, a component mounting device, and a reflow device in a component mounting system, wherein the at least one processing device is connected to a remote computer via a communication network, the component mounting method comprising:
   updating an operation setting of the at least one processing device to allow remote operation of the at least one processing device for a remote response error, wherein the remote operation can be performed via an input unit of the remote computer; and
   when a request is received for an on-site operation via an input unit of the at least one processing device for the remote response error, updating the operation setting of the at least one processing device to prohibit remote operation of the at least one processing device.

2. A component mounting method for at least one processing device, the at least one processing device being at least one of a solder printing device, an inspection device, a component mounting device; and a reflow device in a component mounting system, wherein the at least one processing device is connected to a remote computer via a communication network; the component mounting method comprising:
   allowing a remote operation of the at least one processing device for a remote response error, wherein the remote operation can be performed via an input unit of the remote computer; and
   prohibiting the remote operation when a predetermined operation of the at least one processing device is performed.

3. The component mounting method of claim 2,
   wherein the predetermined operation is at least any one of opening and closing of a safety cover of the at least one processing device, an operation of a stop button of the at least one processing device, and an attachment and detachment operation for a component supply device or a batch replacement carriage installed in the at least one processing device.

4. A method for managing a processing device in a component mounting system, the method comprising:
   detecting an error occurring in the processing device;
   determining a remote response error;
   updating an operation setting in at least one of a remote computer and the processing device based on the remote response error,
   wherein the processing device is one of a solder printing device, an inspection device, a component mounting device, and a reflow device, and
   wherein the operation setting includes information on whether the remote computer is set for remote operation or whether the processing device is set for on-site operation.

5. The method of claim 4, wherein when the remote computer is set for remote operation a worker is capable of operating the processing device from a remote location with the remote computer via a communication network.

6. The method of claim 4, wherein when the processing device is set for on-site operation, a worker is capable of operating the processing device directly via an operation panel positioned at the processing device.

7. The method of claim 4, wherein when the remote computer is set for remote operation, the processing device can be remotely operated via an input unit of the remote computer, wherein the input unit includes at least one of a keyboard, a touch panel, and a mouse.

8. The method of claim 7, further comprising, updating the operation setting to prohibit remote operation when an on-site operation is requested at the processing device.

9. The method of claim 7, further comprising updating the operation setting to prohibit remote operation after a predetermined time in which no remote operation has been executed by the worker on the processing device.

10. The method of claim 4, further comprising, providing a notification according to a first notification pattern or a second notification pattern based on the type of the detected error and whether an input unit of the processing device is in operation when the error is detected.

11. The method of claim 4, further comprising, detecting whether a predetermined operation has been performed in the processing device.

* * * * *